United States Patent
Lee et al.

(10) Patent No.: US 6,573,139 B2
(45) Date of Patent: Jun. 3, 2003

(54) METHOD OF FABRICATING CELL OF FLASH MEMORY DEVICE

(75) Inventors: Seong-soo Lee, Sungnam (KR); Joon Kim, Seoul (KR); Kang-ill Seo, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/903,977

(22) Filed: Jul. 12, 2001

(65) Prior Publication Data

US 2002/0052082 A1 May 2, 2002

(30) Foreign Application Priority Data

Oct. 27, 2000 (KR) ........................................ 2000-63437

(51) Int. Cl.[7] .............................................. H01L 21/336
(52) U.S. Cl. ........................ 438/257; 438/593; 257/315; 257/316
(58) Field of Search ................................ 438/257, 593; 257/315, 316

(56) References Cited

U.S. PATENT DOCUMENTS

| | | | |
|---|---|---|---|
| 5,635,748 A | 6/1997 | Nishizaka | 257/390 |
| 5,675,162 A | 10/1997 | Hong | 257/316 |
| 5,688,705 A | * 11/1997 | Bergemont | 438/257 |
| 5,696,019 A | 12/1997 | Chang | 437/67 |
| 6,153,469 A | * 11/2000 | Yun et al. | 257/315 |

* cited by examiner

Primary Examiner—Amir Zarabian
Assistant Examiner—Jeff Vockrodt
(74) Attorney, Agent, or Firm—Mills & Onello LLP

(57) ABSTRACT

A method of forming a floating gate electrode of a cell of a flash memory device having an interval less than a critical dimension (CD) in a conventional photolithographic process, in which the reliability of a dielectric layer does not deteriorate and damage to a floating gate electrode during etching is prevented, is provided. According to the present invention, a protective layer formed of a material having a high etching selectivity with respect to a device isolation layer and a doped polysilicon layer is formed on the upper surface of the doped polysilicon layer forming the floating gate electrode. The protective layer is partially etched and includes a recess. Next, a material layer for forming a spacer, which is formed of a material having a high etching selectivity with respect to the device isolation layer and the doped polysilicon layer, is formed on the upper surface of the protective layer and is etched back, thus forming the spacer. Damage to the doped polysilicon layer during etching is prevented by the protective layer containing the recess. The floating gate electrode, which is arranged at an interval less than a limit value in a photolithographic process, can be formed by the spacer. The spacer and the protective layer are removed, and a step difference does not occur at edges of the floating gate electrode. Thus deterioration of the reliability of a dielectric layer formed on top of the floating gate electrode can be prevented.

19 Claims, 6 Drawing Sheets

METHOD OF FABRICATING CELL OF FLASH MEMORY DEVICE

BACKGROUND OF THE INVENTION

1. Field of the Invention

The present invention relates to a method of fabricating semiconductor memory devices, and more particularly, to a method of fabricating a cell of a flash memory device.

2. Description of the Related Art

In a semiconductor flash memory device, information stored in a memory cell is not lost even though power is not supplied to the flash memory device. Thus, the flash memory device is widely used in computer memory cards. A cell on which a floating gate electrode and a control gate electrode are stacked in order is widely employed as a unit cell of the flash memory device.

FIG. 1 is a layout view of parts of a cell array region of a conventional NOR-type flash memory device. A plurality of word line patterns 115 are arranged in parallel with one another, and an active region pattern 111 crosses the word line patterns 115. Common source region patterns S extending from the active region pattern 111 are arranged in parallel with the word line patterns 115 between a pair of the word line patterns 115. The active region pattern 111 facing the common source region patterns S between the word line patterns 115 corresponds to drain regions D of a cell. Bit line contact patterns 117 are arranged in each of the drain regions D, and bit line patterns 119 covering the bit line contact patterns 117 are arranged perpendicular to the word line patterns 115. Etching mask patterns 113 for separating floating gates of cells neighboring the word line patterns 115 are arranged between the bit line patterns 119.

In order to improve the characteristics of a unit cell of the flash memory device having the structure of FIG. 1, it is important to increase capacitance between the floating gate electrode and the control gate electrode. A technique in which an interval between neighboring floating gate electrodes is formed to be smaller than the resolution limit of a photolithographic process using the etching mask patterns 113 and a technique in which a spacer remains along edges of the floating gate electrodes for maximizing an area where the floating gate electrodes overlap with the control gate electrodes, are used as methods for increasing the capacitance.

One of the techniques is disclosed in U.S. Pat. No. 5,675,162. In U.S. Pat. No. 5,675,162, a spacer is formed on top of edges of the floating gate electrodes, and a dielectric layer composed of oxide-nitride-oxide (ONO) or nitride-oxide (NO) material and control gate electrodes are stacked on top of the floating gate electrodes, thus maximizing the capacitance between the floating gate electrodes and the control gate electrodes. However, since the upper portion of the spacer formed on the floating gate electrodes has a pointed shape, the electric field has a high flux between the spacer and the control gate electrode. Thus, a breakdown voltage across the dielectric layer interposed between the floating gate electrode and the control gate electrode is reduced, and the reliability of a dielectric layer and the device is reduced.

Another method for increasing the area overlapped by the floating gate electrode and the control gate electrode is described in FIGS. 2 through 5, which are sectional views taken along line B–B' of FIG. 1. In FIG. 2, a device isolation layer 12 defining an active region is formed on a semiconductor substrate 10 using an active region pattern 111. A 50–100 Å thick thin tunnel oxide film 14 is formed on the active region. The tunnel oxide film 14 is formed of thermal oxide. A polysilicon layer 16 and an antireflective layer 18 are sequentially formed on the entire surface of the semiconductor substrate on which the tunnel oxide film 14 is formed. A photoresist etching mask pattern 20 is formed on a first upper portion of the antireflective layer 18.

In FIG. 3, all of the antireflective layer 18 and parts of the polysilicon layer 16 are removed in areas not protected by the photoresist etching mask pattern 20, so that an antireflective layer pattern 18a and polysilicon layers 16 and 16a having a recess are formed on the semiconductor substrate 10. Next, after the photoresist etching mask pattern 20 is removed (not shown), a silicon nitride film 21 is formed over the antireflective layer pattern 18a and the polysilicon layers 16 and 16a.

In FIG. 4, a spacer 22 formed of silicon nitride is formed along the sides of the antireflective layer pattern 18a and along the edges of both sides of the recess by etching back the entire surface of the silicon nitride film 21. The polysilicon layers 16 and 16a are completely removed using the spacer 22, thereby exposing the upper surface of the device isolation layer 12.

In FIG. 5, the antireflective layer pattern 18a and the spacer 22 are removed using phosphoric acid. Next, the polysilicon layers 16 and 16a are converted into a doped polysilicon layer pattern 16b by doping them with impurity ions. An interlevel dielectric (ILD) layer 24 and a doped polysilicon layer 26 are sequentially formed on the entire surface of the semiconductor substrate on which the polysilicon layer pattern 16b including a step difference is formed. The ILD layer 24 is typically composed of oxide-nitride-oxide (ONO) or nitride-oxide (NO) material. Next, the doped polysilicon pattern 16b, the ILD layer 24, and the doped polysilicon layer 26 are patterned using a predetermined photoresist mask pattern, and then, the floating gate electrode, the dielectric layer, and the control gate electrode are formed.

In these prior structures, the surface of the polysilicon layer 16a contacting the spacer 22 is damaged from etching during an etching process. Thus, a step difference is formed on the uppermost portion of the floating gate electrode and, similar to U.S. Pat. No. 5,675,162, the reliability of the ILD layer interposed between the floating gate electrode and the control gate electrode beneath a step difference deteriorates.

SUMMARY OF THE INVENTION

To solve the above problems, it is an object of the present invention to provide a method of fabricating a cell of a flash memory device, in which an interval between neighboring floating gate electrodes can be reduced to less than a critical dimension (CD), and which includes a floating gate electrode in which etching damage and a step difference can be prevented.

According to the invention, there is provided a method of fabricating a cell of a flash memory device. A semiconductor substrate including a device isolation layer is provided. A first conductive layer is formed on the surface of the semiconductor substrate. A protective layer of a material having a high etching selectivity with respect to the device isolation layer and the first conductive layer is formed on the upper surface of the first conductive layer. Portions of the protective layer located directly above the device isolation layer are removed to form a protective layer pattern having a recess. The semiconductor substrate on which the protective layer pattern is formed is etched to expose the first conductive layer and to form a spacer of a material having a high etching selectivity with respect to the device isolation layer and the first conductive layer on lower edges of the recess. The exposed first conductive layer is patterned using the spacer to expose the surface of the device isolation layer. The spacer and the protective layer pattern are then removed.

The protective layer and the spacer may be formed of a silicon film containing nitrogen, for example, a silicon nitride film or a silicon oxynitride film. In a case where the spacer and the protective layer may be formed of the same material, the spacer and the protective layer can be removed using phosphoric acid at one time, thus simplifying the manufacturing process.

The first conductive layer may be a doped polysilicon layer in a NAND-type flash memory device, and may be an undoped polysilicon layer in a NOR-type flash memory device. If the first conductive layer is to be doped, doping is performed after removing the spacer and the protective layer pattern.

Forming the spacer can include forming a material layer of a material having a high etching selectivity with respect to the device isolation layer and the first conductive layer on the surface of the semiconductor substrate on which the protective layer pattern is formed The surface of the material layer can be etched back until the first conductive layer is exposed. Here, the thickness of the material layer can be 500–1500 Å. The first conductive layer is covered by the protective layer before an etching back process, thus preventing the first conductive layer from being damaged during etching. The protective layer may be formed of an antireflective layer, which is essentially used in forming a photoresist mask pattern, without forming a specific layer. In this case, an additional process is not required, thus the process does not become complicated. Next, the first conductive layer is etched using the spacer and the protective layer.

After removing the spacer and the protective layer pattern, an insulating layer and a second conductive layer can be sequentially formed on the surface of the semiconductor substrate on which the patterned first conductive layer is formed. The first conductive layer, the insulating layer, and the second conductive layer can be patterned further to form a floating gate electrode, a dielectric layer, and a control gate electrode, respectively, and a source region and a drain region can be formed on an active region of the semiconductor substrate using the dielectric layer and the control gate electrode. Here, the second conductive layer may be formed of a doped polysilicon layer or a polysilicide layer containing refractory metal, and the polysilicide layer containing refractory metal may be formed of a tungsten silicide film or a titanium silicide film. The insulating layer may be composed of oxide-nitride-oxide (ONO) or nitride-oxide (NO) material.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
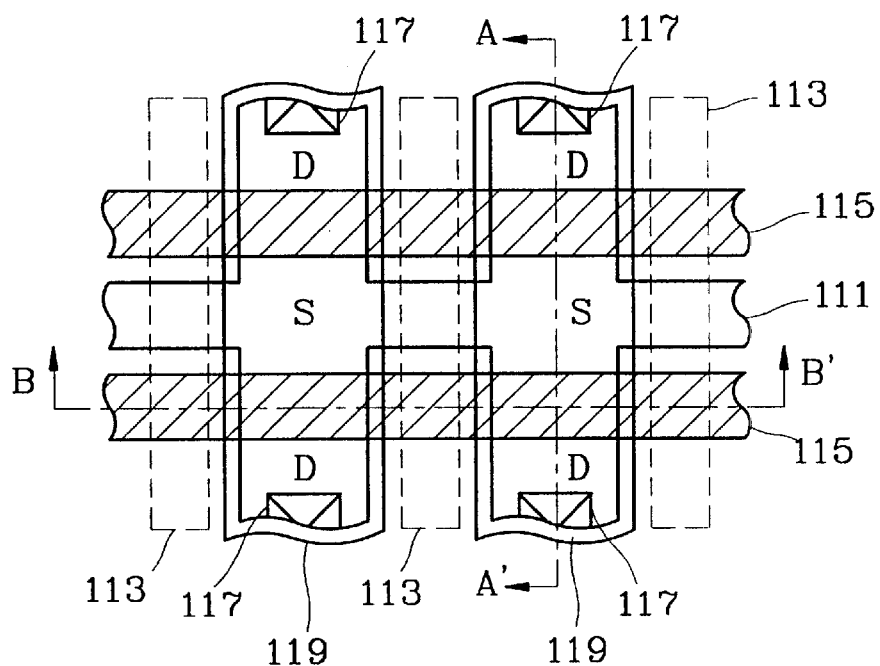
FIG. 1 is a layout view of parts of a cell array region of a conventional NOR-type flash memory device.
Figure 2:
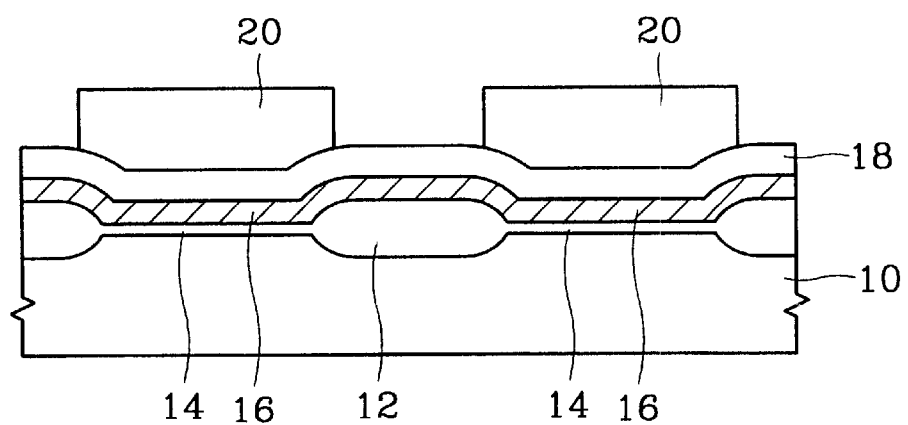
FIGS. 2 through 5 are process sectional views taken along line B–B' of FIG. 1 illustrating a conventional method of fabricating a cell of a flash memory device.
Figure 3:
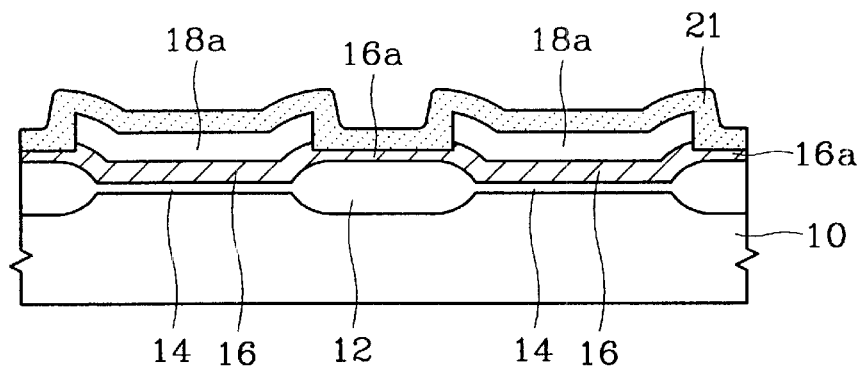
Figure 4:
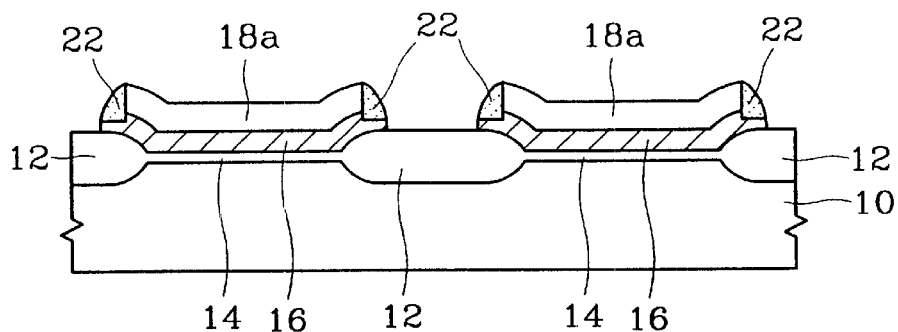
Figure 5:
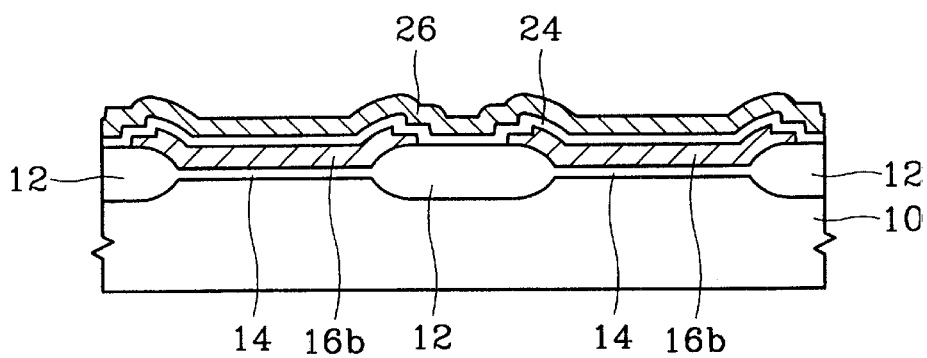
Figure 6A:
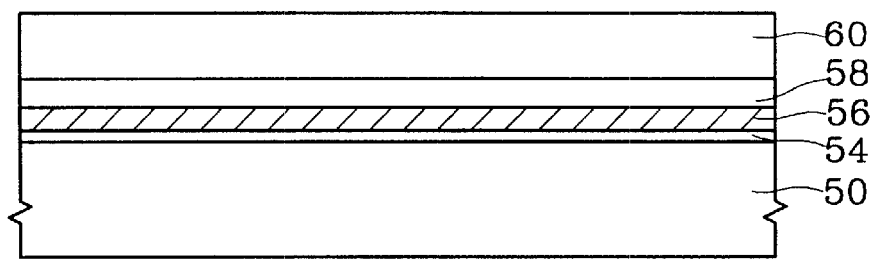
FIGS. 6A, 7A, 8A, 9A, 10A, and 11A are process sectional views taken along line A–A' of FIG. 1 illustrating one embodiment of a method of fabricating a cell of a flash memory device according to the present invention.
Figure 6B:
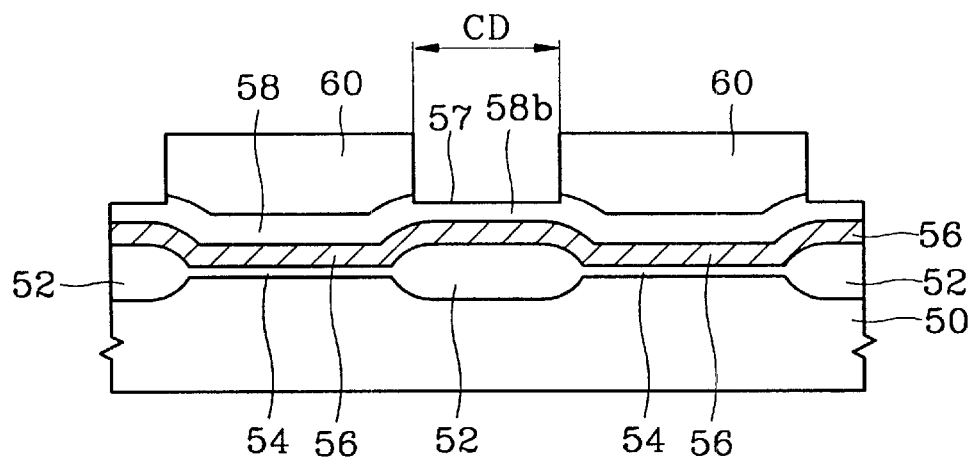
FIGS. 6B, 7B, 8B, 9B, 10B, and 11B are process sectional views taken along line B–B' of FIG. 1 illustrating a method of fabricating a cell of a flash memory device according to the present invention.

Referring to FIGS. 6A and 6B, a tunnel oxide film 54 is formed on an active region of a semiconductor substrate 50 on which a device isolation layer 52 for defining an active region is formed. A first conductive layer 56 is formed on the entire surface of the semiconductor substrate 50 on which the tunnel oxide film 54 is formed. The preferred embodiment relates to a NOR-type flash memory device, and an undoped polysilicon layer is used as the first conductive layer 56. However, in the case of a NAND-type flash memory device, a doped polysilicon layer is used as the first conductive layer 56.

A 500–1500 Å thick protective layer 58 is formed on the upper surface of the first conductive layer 56. The protective layer may be formed of an antireflective layer, which is essentially used in patterning a photoresist mask. The protective layer 58 is formed of a material having a high etching selectivity with respect to the device isolation layer 52 and the first conductive layer 56. Since the device isolation layer 52 is formed of an oxide film, and the first conductive layer 56 is formed of undoped polysilicon layer, the protective layer 58 is preferably formed of a silicon film containing nitrogen. A silicon nitride film or a silicon oxynitride film may be used as the silicon film containing nitrogen.

A photoresist etching mask pattern 60 spaced apart from a critical dimension (CD) in a conventional etching process, is formed on the upper surface of the protective layer 58. The protective layer 58 directly above the device isolation layer 52 is removed to a predetermined depth, leaving the protective layer 58b with a recess 57 arranged above the device isolation layer 52. Reference numeral 58b denotes a portion of the initial protective layer where the recess 57 is formed, and the thickness of the protective layer 58b corresponds to $\frac{1}{10}$ through $\frac{1}{3}$ of the thickness of the initial protective layer 58. That is, the depth of the recess 57 corresponds to $\frac{2}{3}$ through $\frac{9}{10}$ of the thickness of the protective layer 58. Since the thickness of the protective layer 58 is 500–1500 Å, the thickness of the protective layer 58b is 50–500 Å. Next, a photoresist etching mask pattern 113 (not shown) is removed.

Figure 7A:
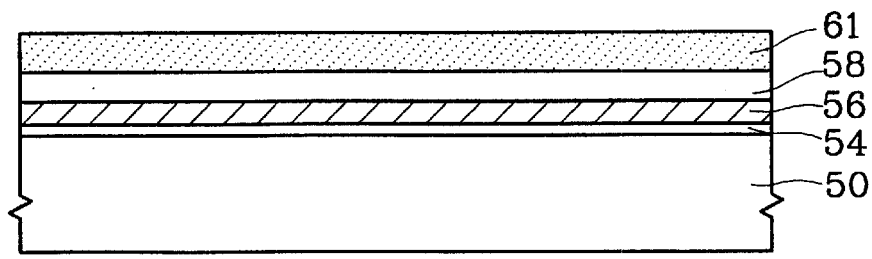
Figure 7B:
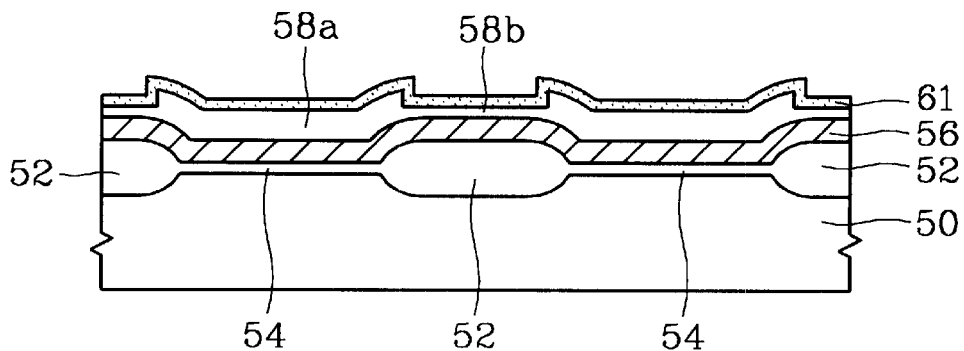

Referring to FIGS. 7A and 7B, a 500–1500 Å thick material layer for forming a spacer 61 is formed on the protective layers 58 and 58b. Preferably, the material layer 61 is formed of a material having a high etching selectivity with respect to the device isolation layer 52 and the first conductive layer 56. In this embodiment, like the protective layer 58, the material layer 61 is formed of a silicon film containing nitrogen, for example, a silicon nitride film or a silicon oxynitride film.

Figure 8A:
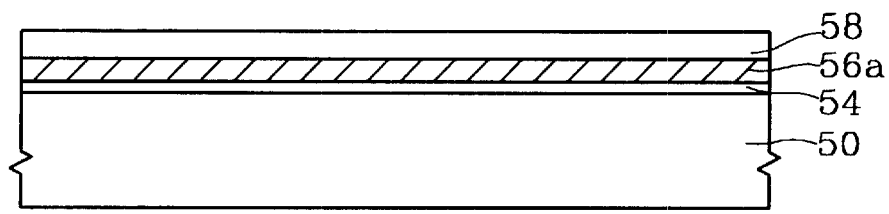
Figure 8B:
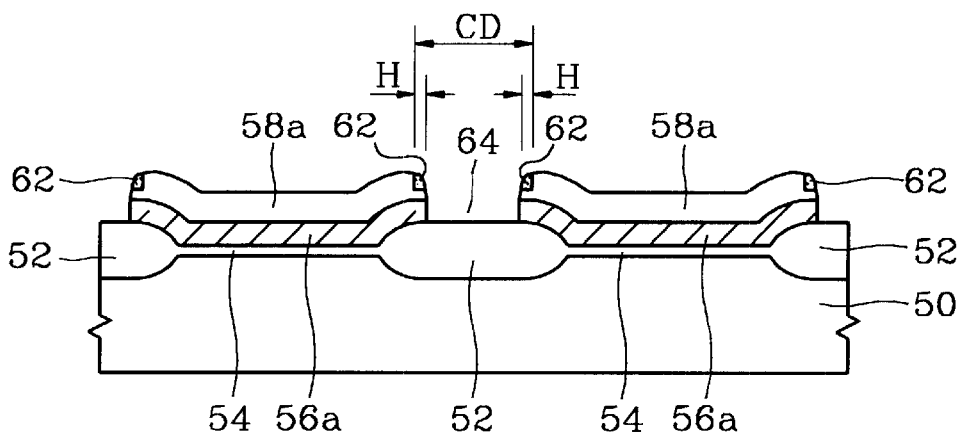

Referring to FIGS. 8A and 8B, the entire surface of the material layer 61 is etched back, forming a spacer 62 along the edges of both sides of the recess in the protective layer 58. Here, the surface of the first conductive layer 56 may be exposed when the spacer 62 is formed. However, during a process of forming the spacer 62 in FIG. 7B, the first conductive layer 56 is covered by the thin protective layer 58b, and the surface of the protective layer 58b is etched. Thus, damage in etching the entire surface of the first conductive layer 56 to be exposed is prevented. Next, the portion of the first conductive layer 56 above which the recess is formed, that is, the first conductive layer 56 arranged directly above the device isolation layer 52, is removed using the spacer 62 and the protective layer 58b as a mask, thus forming a protective layer pattern 58a and a first conductive layer pattern 56a and exposing the surface of the device isolation layer 52. Here, the first conductive layer pattern 56a is separated at an interval which corresponds to a CD in a conventional photolithographic process less the sum of double (2H) the width of a spacer.

Next, the protective layer pattern 58a and the spacer 62 are removed. Wet etching is used as a method for removing the protective layer pattern 58 and the spacer 62. Here, when the protective layer pattern 58a and the spacer 62 are formed of the same material, a removal process is required only one time, and the overall manufacturing process can be simplified. In particular, in a case where the protective layer pattern 58a and the spacer 62 are formed of the same material and the silicon nitride film or the silicon oxynitride film are used, phosphoric acid may be used.

Figure 9A:
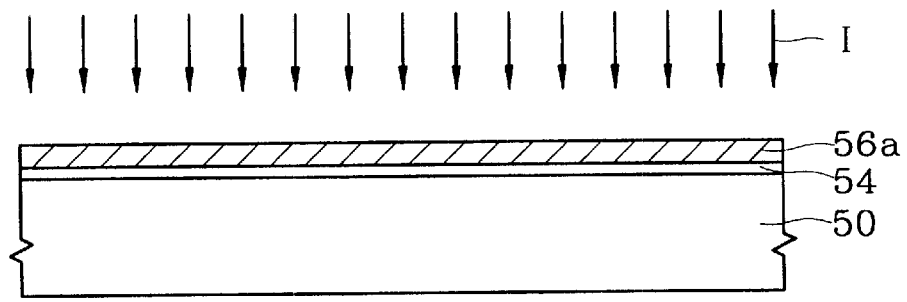
Figure 9B:
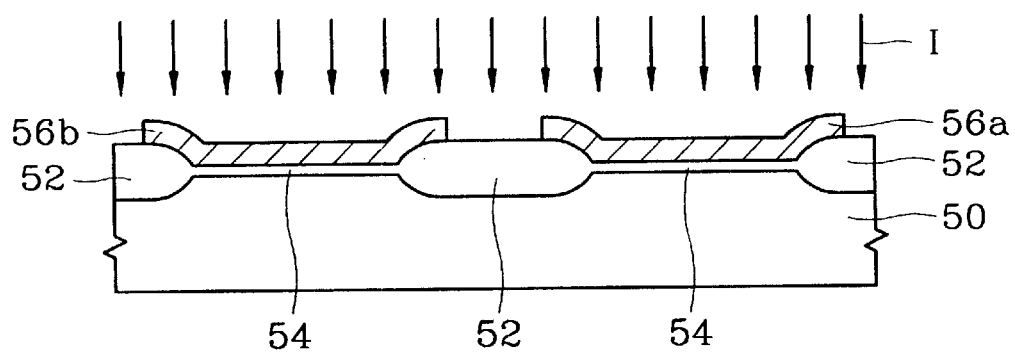

Referring to FIGS. 9A and 9B, the preferred embodiment relates to a NOR-type flash memory device, and an undoped polysilicon is used as the first conductive layer pattern 56a, and an ion implantation process is performed on the entire surface of the semiconductor substrate 50 on which the first conductive layer pattern 56a is formed, and then, the first conductive layer pattern 56a is doped.

However, as described above, in the NAND-type flash memory device, the step is omitted, and the first conductive layer pattern 56a is formed of a doped polysilicon layer.

Figure 10A:
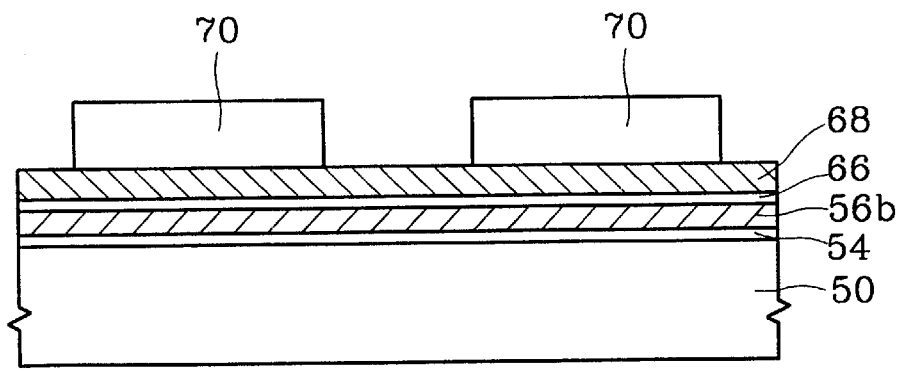
Figure 10B:
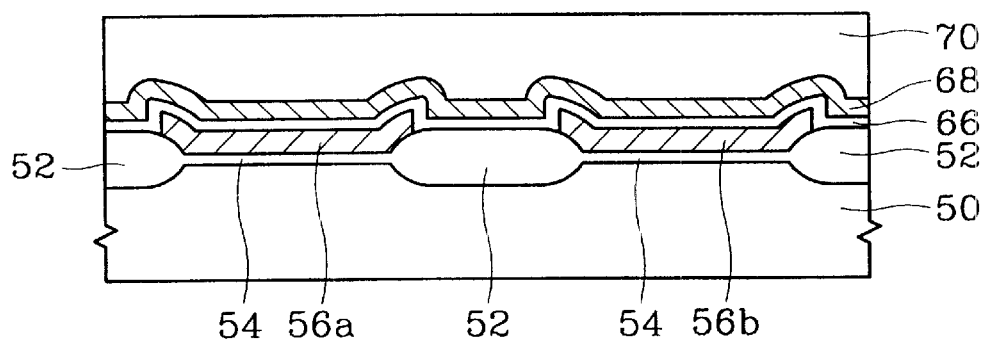

Referring to FIGS. 10A and 10B, an insulating layer 66 and a second conductive layer 68 are sequentially formed on the upper surface of the doped first conductive layer pattern 56b, and a photoresist mask pattern 70 is formed on the upper surface of the second conductive layer 68. The insulating layer 66 is composed of oxide-nitride-oxide (ONO) or nitride-oxide (NO) material. The second conductive layer 68 may be formed of a doped polysilicon layer or a polysilicide layer containing refractory metal. The polysilicide layer containing refractory metal is formed of a tungsten silicide film or a titanium silicide film.

Figure 11A:
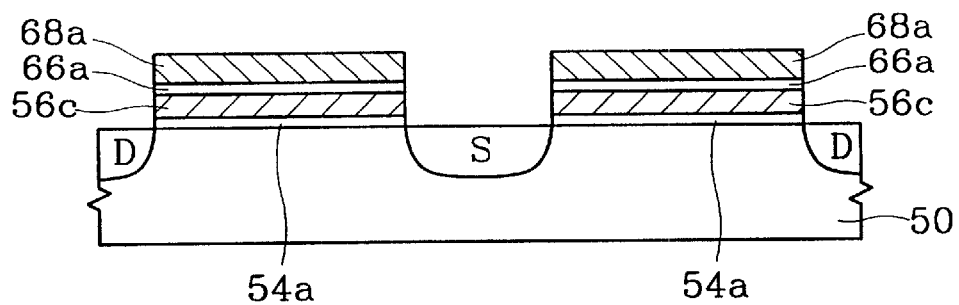
Figure 11B:
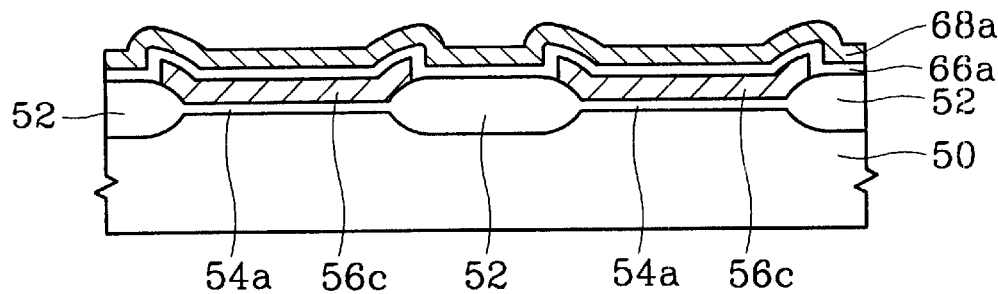

Referring to FIGS. 11A and 11B, the second conductive layer, the insulating layer 66, and the doped first conductive layer pattern 56b are patterned using the photoresist mask pattern 70, and then a control gate electrode 68a, a dielectric layer 66a, and a floating gate electrode 56c are formed. However, the spacer 62 for overcoming the limitations of a conventional photolithographic process is simultaneously removed when the protective layer pattern 58a is removed, thus a step difference does not occur along the edges on the upper surface of the device isolation layer of the floating gate electrode 56c. Next, an ion implantation process is performed using the control gate electrode 68a, the dielectric layer 66a, and the floating gate electrode 56c, resulting in the formation of a source region S and a drain region D.

As described in the preferred embodiment, the present invention has several advantages. Since the step difference does not occur along the edges of the floating gate electrode 56c, loss of the reliability of the dielectric layer 66a formed on top of the floating gate electrode 56c can be prevented.

The protective layer 58 is formed on top of the first conductive layer 56 forming the floating gate electrode 56c, parts of the surface of the protective layer 58 are etched, and the recess 57 is formed. Thus, the effects of an etching process are not transferred to the first conductive layer 56, and damage to the first conductive layer 56 or the floating gate electrode 56c caused during etching can be prevented.

The protective layer 58 and the spacer 61 or the material layer for forming a spacer 62 are formed of a material having a high etching selectivity with respect to the device isolation layer 52 and the first conductive layer 56. Thus, the device isolation layer 52 and the first conductive layer 56a are not etched, even when the protective layer 58 and the spacer 61 are removed in a state where the upper surface of the device isolation layer 52 and sides of the first conductive layer 56a are exposed.

In a case where the spacer 61 and the protective layer 58 are formed of the same material, they can be removed at the same time. Thus, a process of fabricating a flash memory device can be simplified.

The antireflective layer, which is necessarily used in patterning the photoresist, can be used as the protective layer. Thus, an additional process for forming the protective layer is not necessary.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of fabricating a cell of a flash memory device, comprising:

providing a semiconductor substrate including a device isolation layer;

forming a first conductive layer on the surface of the semiconductor substrate;

forming on the first conductive layer a protective layer of a material having a high etching selectivity with respect to the device isolation layer and the first conductive layer;

partially removing portions of the protective layer located above the device isolation layer, to form a protective layer pattern having a recess, the recess being located above the device isolation layer and a bottom surface over the first conductive layer such that the portion of the first conductive layer under the recess is not exposed;

etching the semiconductor substrate on which the protective layer pattern is formed to expose the first conductive layer and to form on lower edges of the recess a spacer of a material having a high etching selectivity with respect to the device isolation layer and the first conductive layer;

patterning the exposed first conductive layer using the spacer to expose the surface of the device isolation layer; and removing the spacer and the protective layer pattern.

2. The method of fabricating a cell of a flash memory device according to claim 1, wherein the protective layer is formed of a silicon film containing nitrogen.

3. The method of fabricating a cell of a flash memory device according to claim 2, wherein the silicon film containing nitrogen is one of a silicon nitride film and a silicon oxynitride film.

4. The method of fabricating a cell of a flash memory device according to claim 1, wherein the spacer is formed of a silicon film containing nitrogen.

5. The method of fabricating a cell of a flash memory device according to claim 4, wherein the silicon film containing nitrogen is one of a silicon nitride film and a silicon oxynitride film.

6. The method of fabricating a cell of a flash memory device according to claim 1, wherein the first conductive layer is a doped polysilicon layer.

7. The method of fabricating a cell of a flash memory device according to claim 6, further comprising, after removing the spacer and the protective layer pattern, the steps of:

sequentially forming an insulating layer and a second conductive layer on the surface of the semiconductor substrate on which the patterned first conductive layer is formed;

further patterning the first conductive layer, the insulating layer, and the second conductive layer to form a floating gate electrode, a dielectric layer, and a control gate electrode, respectively; and forming a source region and a drain region on an active region of the semiconductor substrate using the dielectric layer and the control gate electrode.

8. The method of fabricating a cell of a flash memory device according to claim 7, wherein the second conductive layer is one of a doped polysilicon layer and a polysilicide layer containing refractory metal.

9. The method of fabricating a cell of a flash memory device according to claim 8, wherein the polysilicide layer containing refractory metal is formed of one of a tungsten silicide film and a titanium silicide film.

10. The method of fabricating a cell of a flash memory device according to claim 7, wherein the insulating layer is composed of one of oxide-nitride-oxide (ONO) and nitride-oxide (NO) material.

11. The method of fabricating a cell of a flash memory device according to claim 1, wherein the first conductive layer is an undoped polysilicon layer, and the method further comprises doping the first conductive layer after removing the spacer and the protective layer pattern.

12. The method of fabricating a cell of a flash memory device according to claim 11, further comprising, after the step of doping the first conductive layer, the steps of:

sequentially forming an insulating layer and a second conductive layer on the surface of the semiconductor substrate on which the first conductive layer is formed;

further patterning the first conductive layer, the insulating layer, and the second conductive layer, to form a floating gate electrode, a dielectric layer, and a control gate electrode, respectively; and forming a source region and a drain region on an active region of the semiconductor substrate using the dielectric layer and the control gate electrode.

13. The method of fabricating a cell of a flash memory device according to claim 1, wherein the spacer and the protective layer pattern are formed of the same material.

14. The method of fabricating a cell of a flash memory device according to claim 13, wherein the spacer and the protective layer pattern are formed of one of a silicon nitride film and a silicon oxynitride film.

15. The method of fabricating a cell of a flash memory device according to claim 14, wherein the spacer and the protective layer pattern are removed using phosphoric acid.

16. The method of fabricating a cell of a flash memory device according to claim 14, wherein the thickness of the protective layer is 500–1500 Å.

17. The method of fabricating a cell of a flash memory device according to claim 1, wherein forming a spacer comprises:

forming a material layer of a material having a high etching selectivity with respect to the device isolation layer and the first conductive layer on the surface of the semiconductor substrate on which the protective layer pattern is formed; and etching back the surface of the material layer until the first conductive layer is exposed.

18. The method of fabricating a cell of a flash memory device according to claim 17, wherein the thickness of the material layer is 500–1500 Å.

19. The method of fabricating a cell of a flash memory device according to claim 1, wherein the protective layer is formed of an antireflective layer.

* * * * *

UNITED STATES PATENT AND TRADEMARK OFFICE
CERTIFICATE OF CORRECTION

PATENT NO.    : 6,573,139 B2
DATED         : June 3, 2003
INVENTOR(S)   : Seong-soo Lee, Joon Kim and Kang-ill Seo It is certified that error appears in the above-identified patent and that said Letters Patent is hereby corrected as shown below:

<u>Column 6,</u>
Line 46, please insert -- having -- before "a".

Signed and Sealed this

Sixteenth Day of September, 2003

JAMES E. ROGAN
*Director of the United States Patent and Trademark Office*